(12) United States Patent
Devine et al.

(10) Patent No.: US 10,614,986 B2
(45) Date of Patent: Apr. 7, 2020

(54) ELECTRICAL SWITCHING APPARATUS AND GUIDE MEMBER THEREFOR

(71) Applicant: EATON CORPORATION, Cleveland, OH (US)

(72) Inventors: Jack Edward Devine, Pittsburgh, PA (US); Brian Scott Caffro, Aliquippa, PA (US); Kelly J. McCarthy, Pittsburgh, PA (US); Jason Eric Ochs, Larchmont, NY (US); Mark A. Janusek, Bethel Park, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 355 days.

(21) Appl. No.: 15/822,991

(22) Filed: Nov. 27, 2017

(65) Prior Publication Data

US 2019/0164713 A1    May 30, 2019

(51) Int. Cl.
| | |
|---|---|
| *H01H 71/12* | (2006.01) |
| *H01H 71/02* | (2006.01) |
| *H01H 9/02* | (2006.01) |
| *H01H 71/04* | (2006.01) |
| *H05K 9/00* | (2006.01) |
| *H01H 9/18* | (2006.01) |
| *H01H 9/16* | (2006.01) |
| *H01H 9/30* | (2006.01) |

(52) U.S. Cl.
CPC ........ *H01H 71/123* (2013.01); *H01H 9/0271* (2013.01); *H01H 71/0207* (2013.01); *H01H 71/04* (2013.01); *H05K 9/002* (2013.01); *H01H 9/161* (2013.01); *H01H 9/181* (2013.01); *H01H 2009/305* (2013.01)

(58) Field of Classification Search
USPC .................................................. 361/42, 115
See application file for complete search history.

(56) References Cited

U.S. PATENT DOCUMENTS

| | | | |
|---|---|---|---|
| 7,358,836 | B2 | 4/2008 | Carlino et al. |
| 7,869,171 | B2 * | 1/2011 | Weeks ............... H01R 13/4534 361/42 |
| 9,384,910 | B1 | 7/2016 | Kline et al. |
| 9,595,403 | B2 | 3/2017 | Kline et al. |
| 9,715,972 | B2 | 7/2017 | Kline et al. |
| 2019/0006824 | A1 * | 1/2019 | Sasaki ...................... H02B 1/40 |

* cited by examiner

*Primary Examiner* — Danny Nguyen
(74) *Attorney, Agent, or Firm* — Eckert Seamans Cherin & Mellott, LLC

(57) ABSTRACT

A guide member is for an electrical switching apparatus. The electrical switching apparatus includes a primary cover, a secondary cover structured to move between a closed position and an open position, a first printed circuit board, a second printed circuit board spaced from the first printed circuit board, and a cable member electrically connecting the first and second printed circuit boards. The guide member includes a body having a base coupled to the primary cover, a ramp engaging the cable member when the secondary cover is in the closed position, the ramp having first and second opposing end portions, the first end portion extending from the base, and a number of guide portions each extending from the ramp and engaging the cable member when the secondary cover moves between the closed position and the open position in order to minimize twisting and folding of the cable member.

20 Claims, 9 Drawing Sheets

ELECTRICAL SWITCHING APPARATUS AND GUIDE MEMBER THEREFOR

BACKGROUND

Field

The disclosed concept relates generally to electrical switching apparatus such as, for example, circuit breakers. The disclosed concept also relates to guide members for electrical switching apparatus.

Background Information

Electrical switching apparatus are used to protect electrical circuitry from damage due to a trip condition, such as, for example, an overcurrent condition, an overload condition, an undervoltage condition, a relatively high level short circuit or fault condition, a ground fault or arc fault condition. Molded case circuit breakers, for example, include at least one pair of separable contacts which are operated either manually by way of a handle located on the outside of the case, or automatically by way of a trip unit in response to the trip condition.

Many molded case circuit breakers also include, for example, printed circuit boards to interface with accessories inside the circuit breakers and customer connections located external with respect to the circuit breakers. It is common that the number of accessories and customer connections are so large that a single printed circuit board is not feasible to incorporate in the circuit breaker. In such situations, circuit breakers commonly include multiple separate printed circuit boards in the circuit breaker that together function to interface with the accessories and customer interfaces. A typical construction of such a circuit breaker involves installing a first printed circuit board within the circuit breaker, coupling a second, separate printed circuit board to an accessory cover of the circuit breaker, and electrically connecting the two printed circuit boards together with a cable member. Accessory covers of circuit breakers are often opened and closed to allow customers access to the interior of the circuit breaker. As a result, the cable member connecting the printed circuit boards is often twisted and/or folded during opening and closing. Because these cable members are electrically connecting many circuits on the printed circuit boards, they are typically relatively fragile and/or susceptible to damage. As such, repeated twisting and/or folding can cause them to fracture, compromising their ability to electrically connect the two printed circuit boards.

There is thus room for improvement in electrical switching apparatus and guide members therefor.

SUMMARY

These needs and others are met by embodiments of the disclosed concept, which are directed to an improved electrical switching apparatus and guide member therefor.

As one aspect of the disclosed concept, a guide member is provided for an electrical switching apparatus. The electrical switching apparatus includes a primary cover, a secondary cover structured to move between a closed position and an open position, a first printed circuit board coupled to the primary cover, a second printed circuit board coupled to the secondary cover and being spaced from the first printed circuit board, and a cable member electrically connecting the first printed circuit board to the second printed circuit board. The guide member comprises a body comprising a base structured to be coupled to the primary cover, a ramp structured to engage the cable member when the secondary cover is in the closed position, the ramp having a first end portion and a second end portion disposed opposite and distal the first end portion, the first end portion extending from the base, and a number of guide portions each extending from the ramp and being structured to engage the cable member when the secondary cover moves between the closed position and the open position in order to minimize twisting and folding of the cable member.

As another aspect of the disclosed concept, an electrical switching apparatus comprises a primary cover, at least one secondary cover structured to move between a closed position and an open position, a first printed circuit board coupled to the primary cover, a number of other printed circuit boards each coupled to a corresponding secondary cover and being spaced from the first printed circuit board, at least one cable member electrically connecting the first printed circuit board to a corresponding one of the number of other printed circuit boards, and at least one of the aforementioned guide members.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
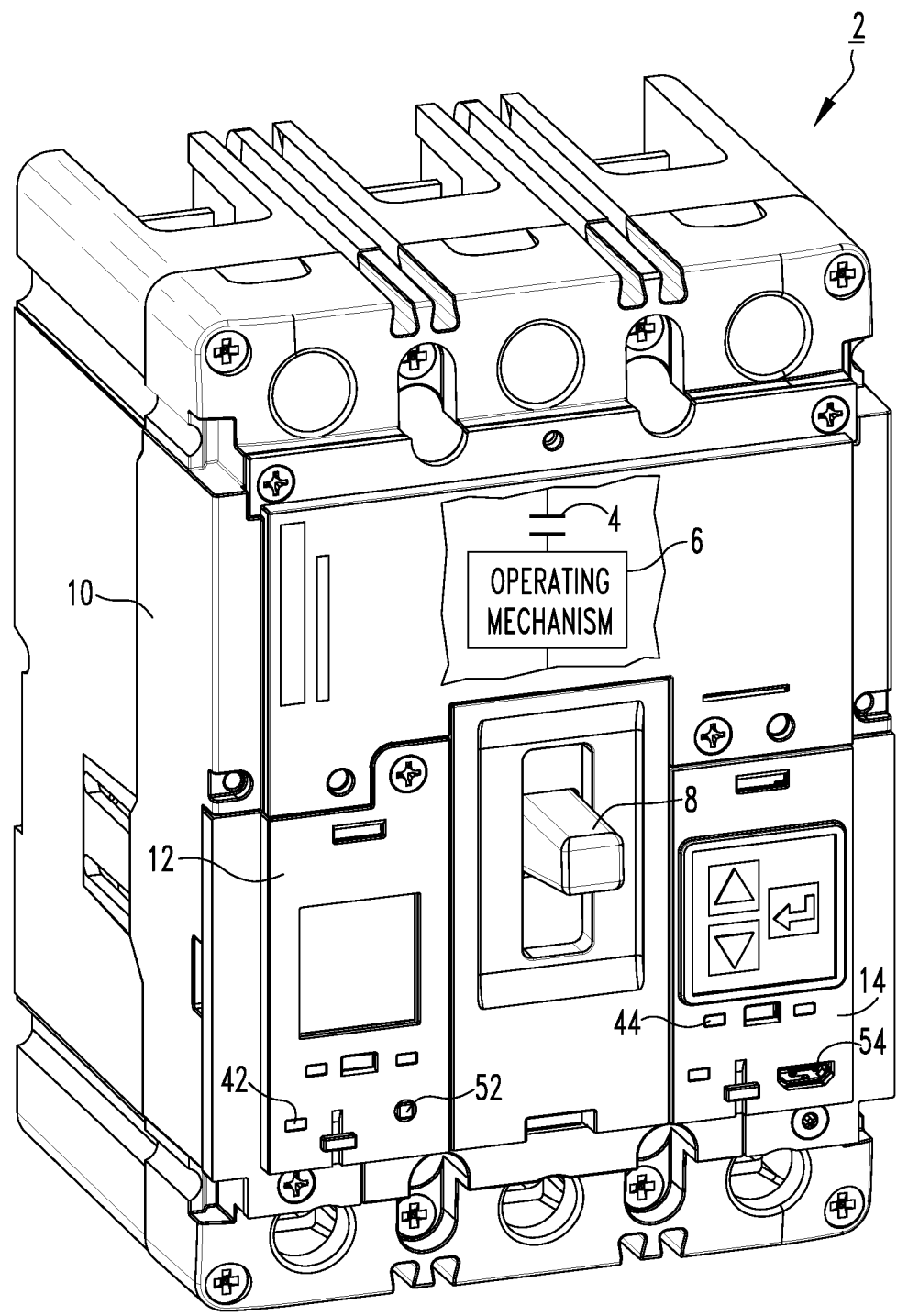
FIG. 1 is a partially simplified isometric view of an electrical switching apparatus, in accordance with one non-limiting embodiment of the disclosed concept.

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the statement that two or more parts or components "engage" one another shall mean that the parts exert a force against one another either directly or through one or more intermediate parts or components.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

As employed herein, the term "coupling member" refers to any suitable connecting or tightening mechanism expressly including, but not limited to, zip ties, wire ties, rivets, screws, bolts, the combination of bolts and nuts (e.g., without limitation, lock nuts), and washers and nuts.

FIGS. 1-7 are different views of an electrical switching apparatus (e.g., without limitation, multi-pole molded case circuit breaker 2), in accordance with one non-limiting embodiment of the disclosed concept. The example circuit breaker 2 includes a pair of separable contacts 4 (shown in simplified form) and an operating mechanism 6 (shown in simplified form) that opens and closes the separable contacts 4 in a generally well known manner. The operating mechanism 6 has a main operating handle 8 that allows operators to manually open and close the separable contacts 4.

Figure 4:
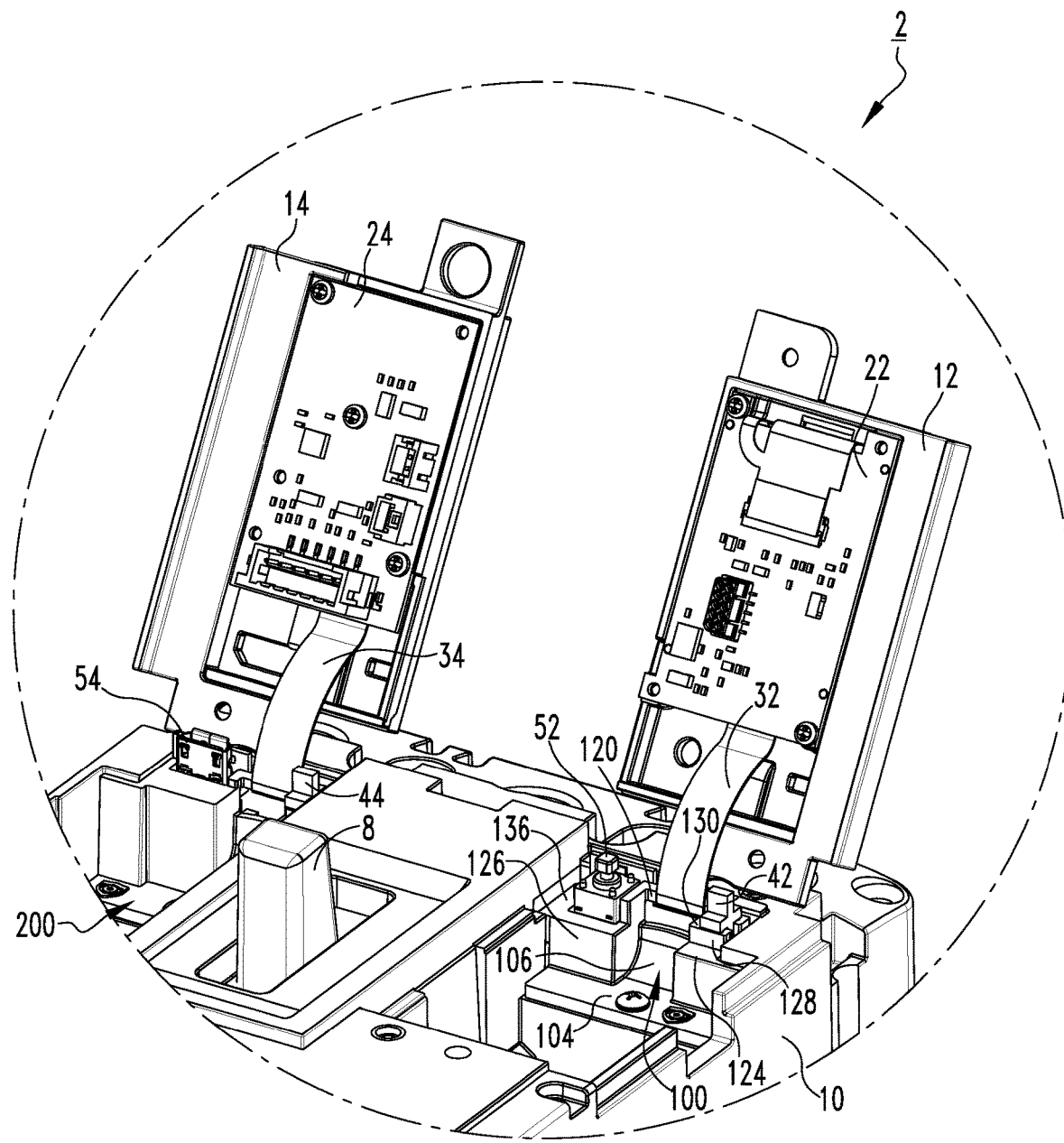
FIG. 4 is an enlarged view of a portion of the electrical switching apparatus and guide member therefor of FIG. 3.
Figure 5:
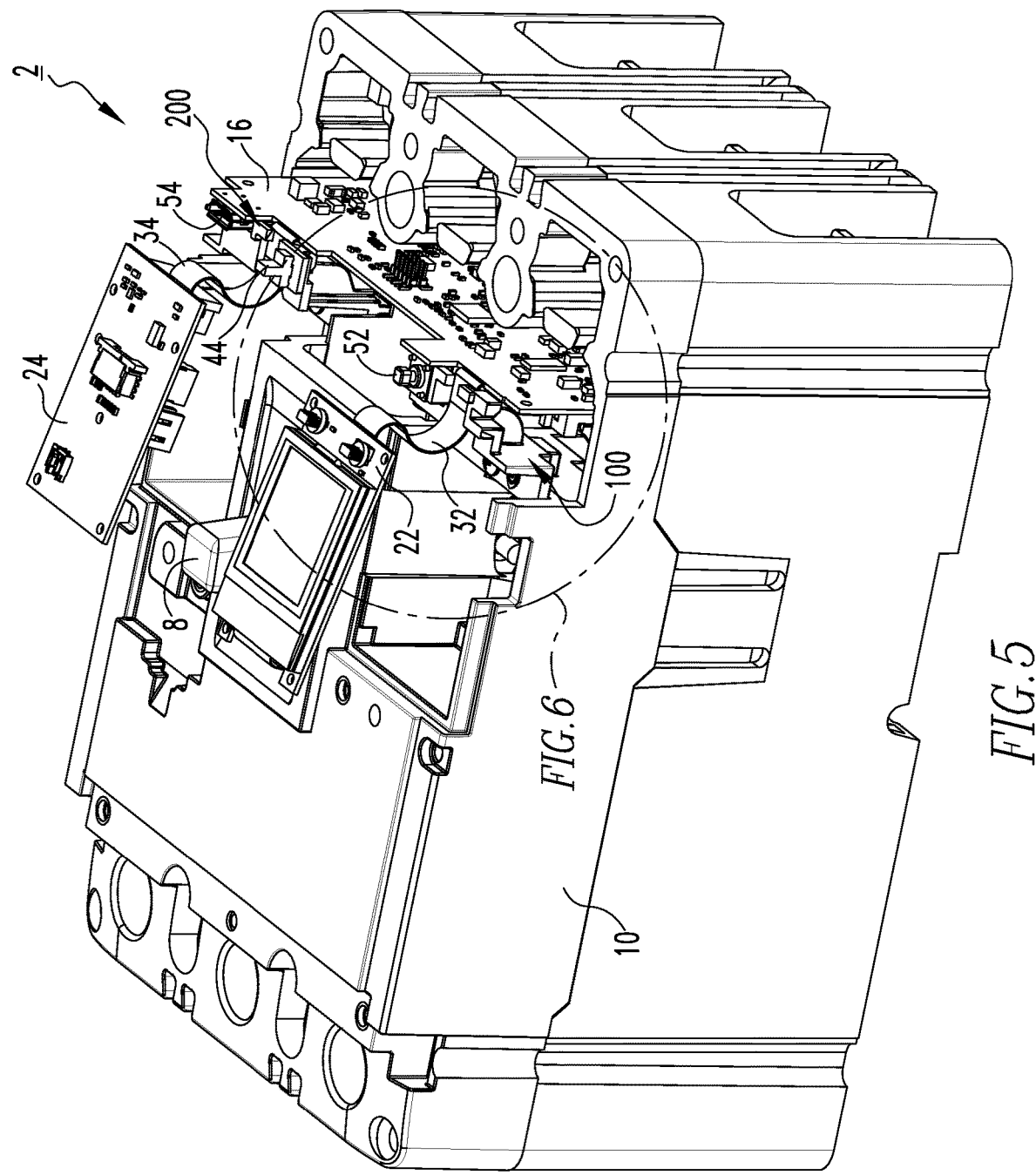
FIG. 5 is another isometric view of the electrical switching apparatus and guide member therefor of FIG. 3, shown with portions removed in order to see hidden structures.
Figure 6:
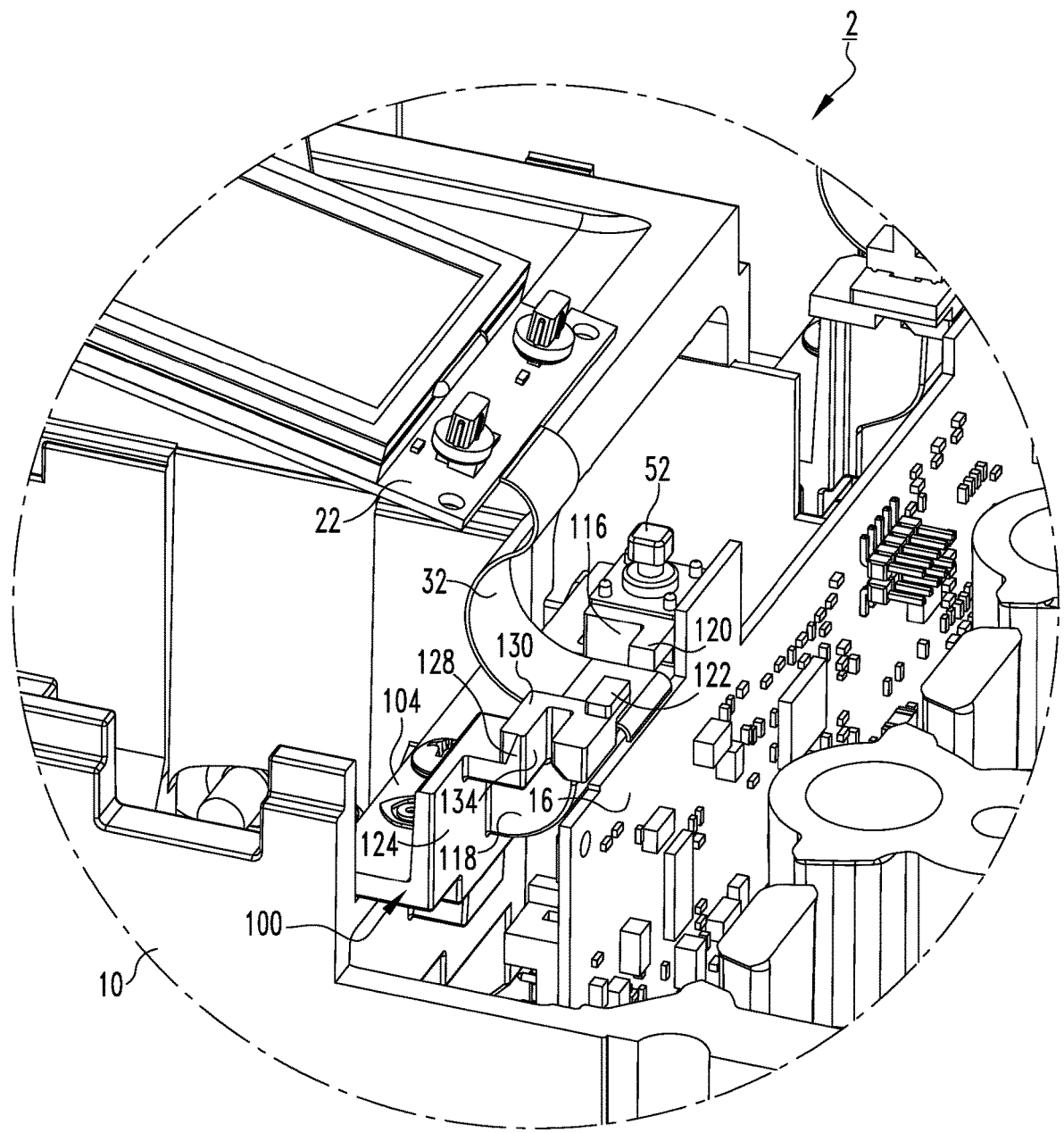
FIG. 6 is an enlarged view of a portion of the electrical switching apparatus and guide member therefor of FIG. 5.
Figure 7:
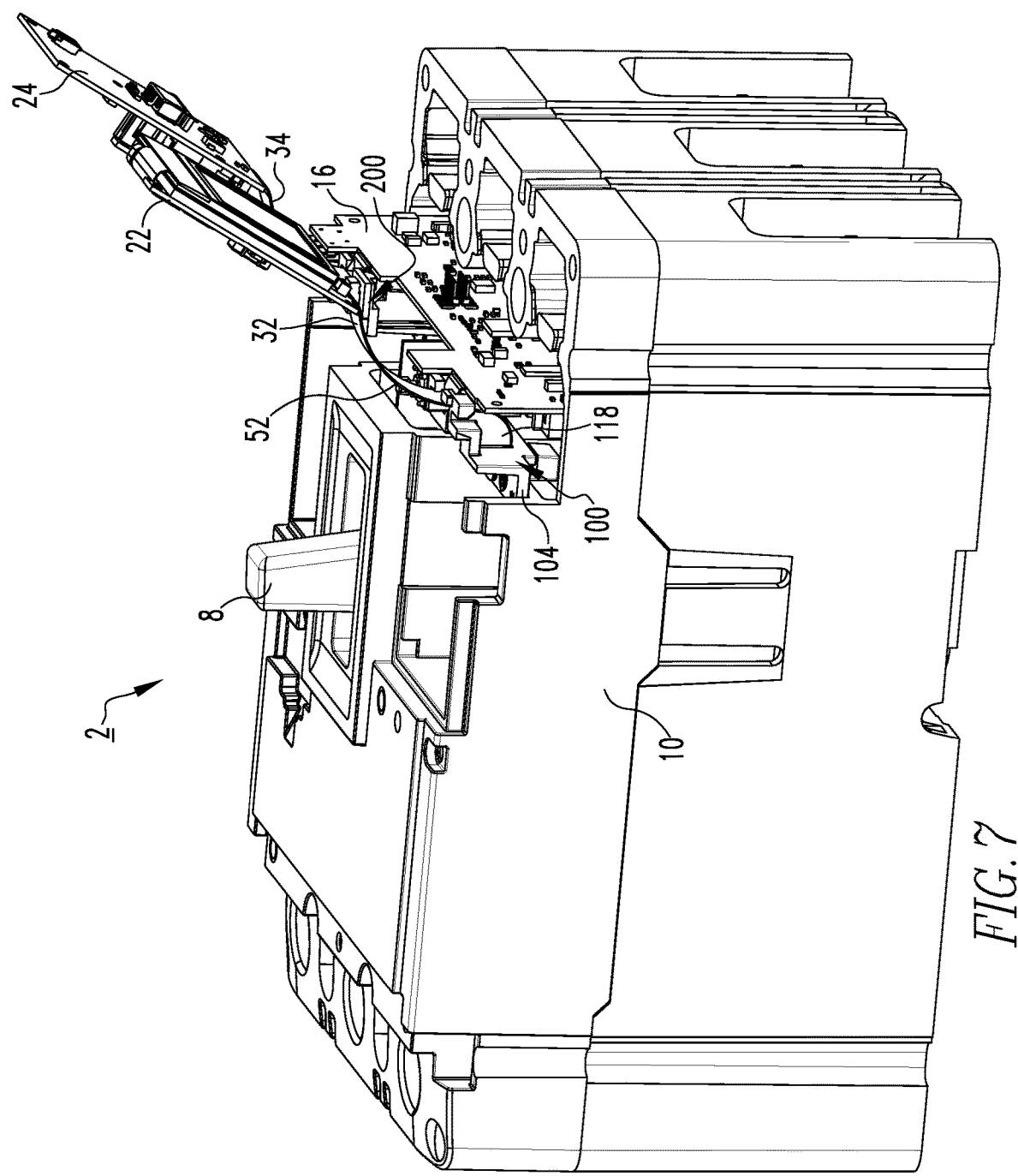
FIG. 7 is another isometric view of the electrical switching apparatus and guide member therefor of FIG. 5.

The circuit breaker 2 also includes a primary cover 10, a number of secondary covers (two example secondary covers 12,14 are shown in FIG. 1), a first printed circuit board (see, for example, first printed circuit board 16, partially shown in FIGS. 5-7) coupled to the primary cover 10, a number of other printed circuit boards (see, for example, second printed circuit board 22 and third printed circuit board 24, shown in FIGS. 3-7), and a number of cable members (see, for example, first cable member 32 and second cable member 34, shown in FIGS. 2-7). The primary cover 10 and the secondary covers 12,14 may be made of any suitable material known in the art (e.g., without limitation, plastic materials).

Referring to FIGS. 5 and 6, the first and second cable members 32,34 each electrically connect the first printed circuit board 16 to a corresponding one of the second and third printed circuit boards 22,24. More specifically, the first and second cable members 32,34 each have a number of traces (e.g., without limitation, copper traces) that electrically connect the first printed circuit board 16 to the second and third printed circuit boards 22,24, respectively, in a generally well known manner.

It will be appreciated that the second and third printed circuit boards 22,24 are spaced from the first printed circuit board 16. These printed circuit boards 22,24 are commonly referred to as "satellite printed circuit boards," in that they are physically removed from (i.e., separated from) first printed circuit boards, such as the first printed circuit board 16. While the second and third printed circuit boards 22,24 are physically removed from the first printed circuit board 16, the first and second cable members 32,34 allow them to be electrically connected thereto, such that the circuit breaker 2 is provided with one main printed circuit board in the form of the first, second, and third printed circuit boards 16,22,24. Furthermore, each of the second and third printed circuit boards 22,24 is coupled to a corresponding one of the secondary covers 12,14, which are structured to move between a closed position and an open position.

In accordance with a novel aspect of the disclosed concept, the circuit breaker 2 further includes a number of guide members (see, for example, guide members 100,200, shown in FIGS. 2-7) each coupled to the primary cover 10. While the circuit breaker 2 has the two example guide members 100,200, for purposes of economy of disclosure, only the guide member 100 will be discussed in greater detail. However, it will be appreciated that the guide member 200 is shaped substantially the same and functions substantially the same as the guide member 100, but is configured to function with the third printed circuit board 24 and the second cable member 34. As will be discussed in greater detail below, the guide members 100,200 provide a mechanism to protect the cable members 32,34, thereby allowing them to advantageously last longer in operation. Specifically, the cable members 32,34 are relatively fragile and/or susceptible to damage as a result of requirements involved in electrically connecting the first printed circuit board 16 to the respective second and third printed circuit boards 22,24. In one example embodiment, the cable members 32,34 include copper traces that are sandwiched between insulating plastic materials, which are bonded by overlay adhesives. The copper traces may be a single layer or there may be multiple layers. Between each layer of copper traces, there may be insulation material.

Figure 8:
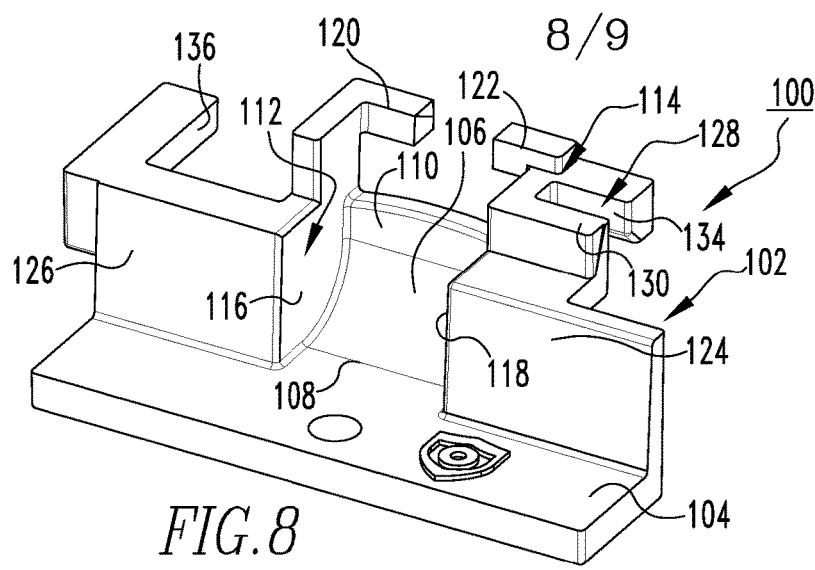
FIGS. 8, 9, and 10 are front, rear, and side isometric views, respectively, of the guide member of FIG. 7.
Figure 9:
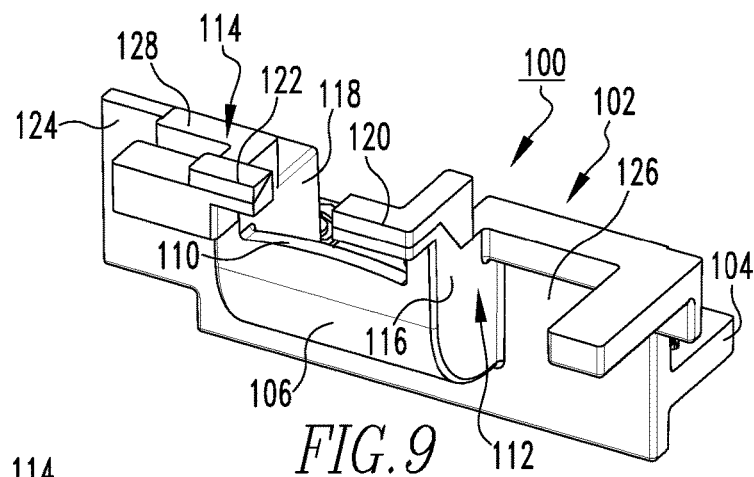
Figure 10:
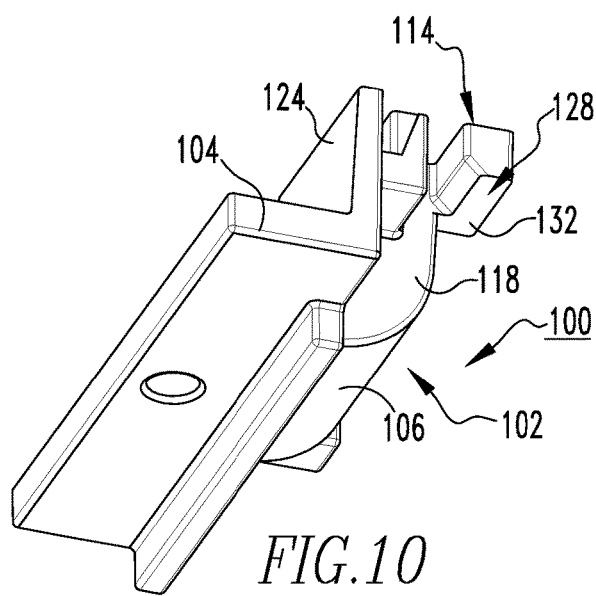

The guide member 100 is preferably a unitary component made from a single piece of material. For example and without limitation, the guide member 100 may be made of any suitable thermoplastic material via an injection molding process. FIGS. 8-10 show different isometric views of the novel guide member 100, which includes a body 102 having a base 104, a ramp 106, a number of guide portions 112,114, a number of barrier portions 124,126, and a number of receiving portions 128,136. The base 104 is generally planar and engages the primary cover 10 (see, for example, FIG. 4) such that a suitable coupling member (shown but not indicated in FIG. 4) can secure the base 104 to the primary cover 10.

Continuing to refer to FIGS. 8-10, the guide portions 112,114 each include a corresponding extension portion 116,118 and a corresponding directing portion 120,122 extending from and being located substantially perpendicular to the extension portion 116,118. The extension portions 116,118 each extend from the ramp 106, and are spaced from and located substantially parallel to each other. The ramp 106 has a first end portion 108 extending from the base 104, and a second end portion 110 located opposite and distal the first end portion 108. The directing portions 120,122 are each located proximate the second end portion 110 of the ramp 106. Furthermore, the directing portion 120 of the first guide portion 112 extends from the extension portion 116 of the first guide portion 112 toward the directing portion 122 of the second guide portion 114, and the directing portion 122 of the second guide portion 114 extends from the extension portion 118 of the second guide portion 114 toward the directing portion 120 of the first guide portion 120.

When assembled into the circuit breaker 2, the ramp 106 is concave facing away from the first printed circuit board 16 (FIGS. 5-7), and is structured to engage the first cable member 32 when the secondary cover 12 is in the closed position. As such, the ramp 106 provides a relatively smooth surface for the first cable member 32 to rest on when the secondary cover 12 is in the closed position. The ramp 106 also assists in preventing debris (e.g., debris generated during separation of the separable contacts 4, FIG. 1) from moving into pocket areas of the circuit breaker 2, or back onto the first printed circuit board 16. Additionally, the extension portions 116,118, which extend from the ramp 106, advantageously protect/shield the first cable member 32 from debris during separation of the separable contacts 4 (FIG. 1). Furthermore, the guide portions 112,114 are structured to engage the first cable member 32 when the secondary cover 12 moves between the closed position and the open position in order to minimize twisting and folding of the first cable member 32. Comparing, for example, FIG. 2 to FIG. 4, which show the circuit breaker 2 with the secondary cover 12 partially open and fully open, respectively, it will be appreciated that as the secondary cover 12 is opened, the directing portions 120 (i.e., and the directing portion 122, hidden in FIGS. 2 and 4) engage the cable member 32 in order to minimize any twisting. As a result, the onset of fracture of the cable member 32 during operation of the circuit breaker 2 is significantly prolonged due to the guide member 100. Accordingly, the integrity of the cable member 32 in the circuit breaker 2 is improved by the guide member 100.

Figure 2:
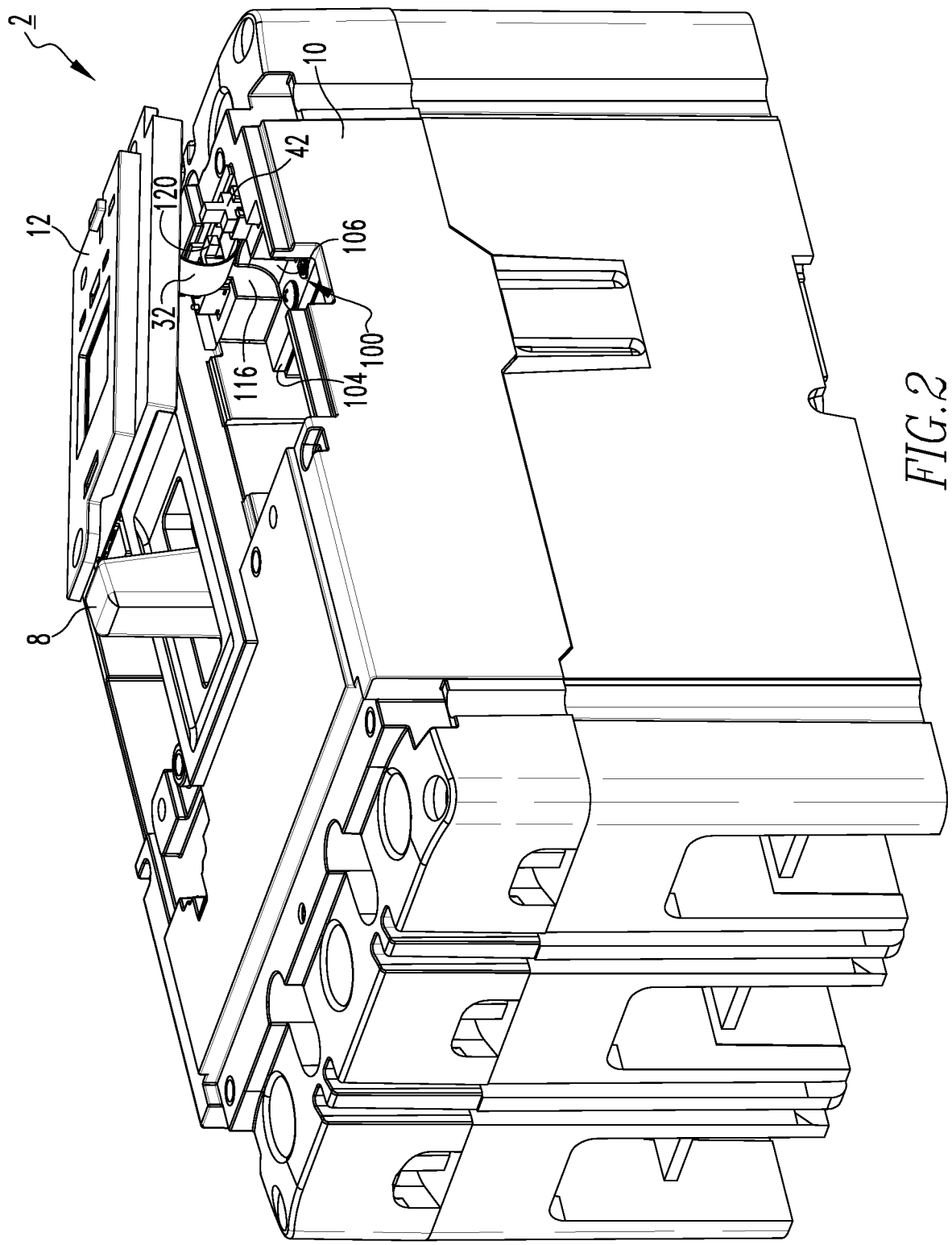
FIG. 2 is an isometric view of the electrical switching apparatus of FIG. 1, shown with a secondary cover partially open, and with a guide member for the electrical switching apparatus.
Figure 3:
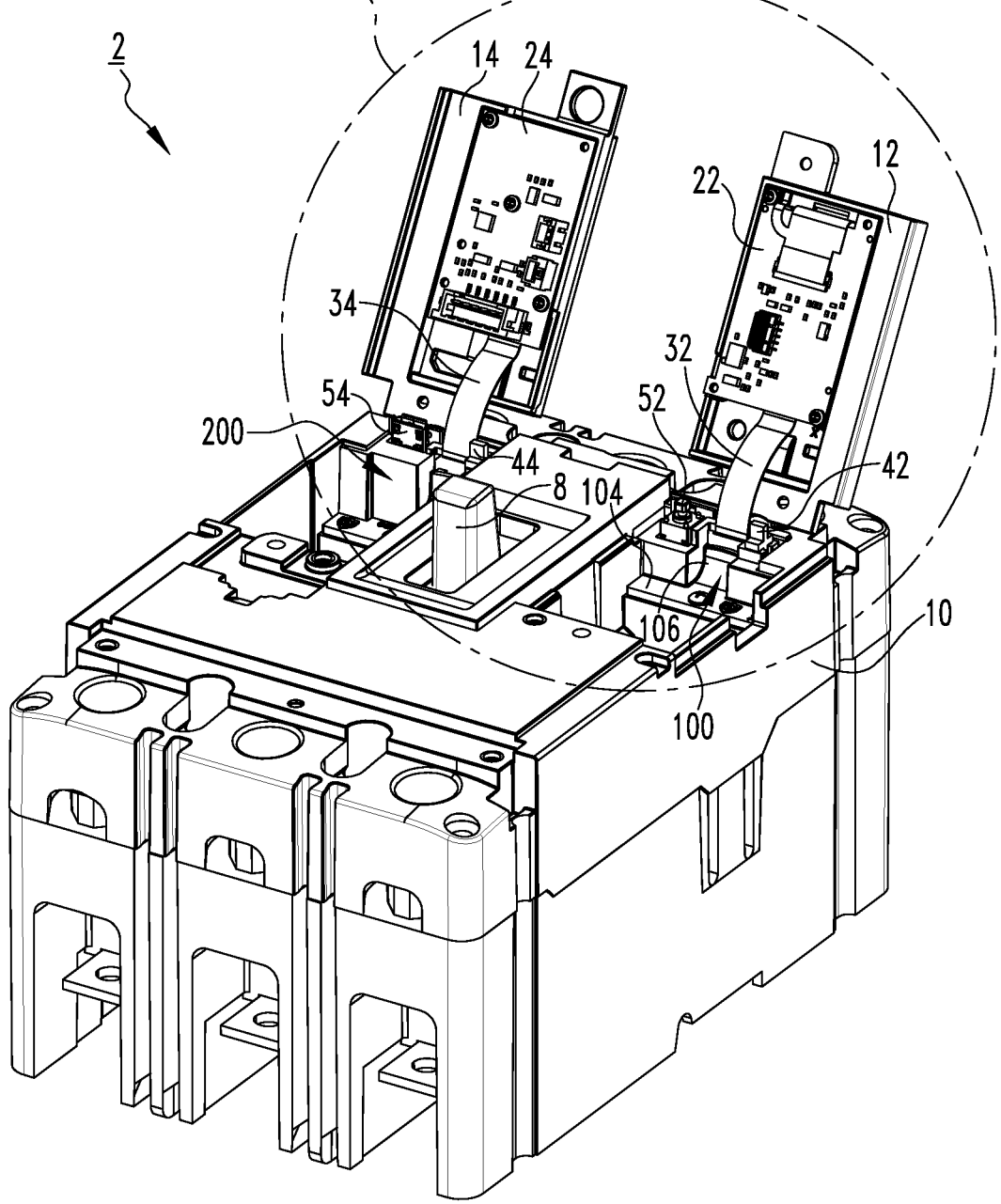
FIG. 3 is an isometric view of the electrical switching apparatus of FIG. 2, shown with a number of secondary covers fully open, and with a number of guide members.

Additionally, comparing FIG. 1 to FIG. 2, which show the circuit breaker 2 with the secondary cover 12 closed and partially open, respectively, it will be appreciated that as the secondary cover is opened, the extension portions 116 (i.e., and the extension portion 118) engage the cable member 32 in order to minimize twisting of the cable member 32, and to position/stabilize the cable member 32 between the extension portions 116,118. As such, when the secondary cover 12 is in the closed position, the cable member 32 is located between and is substantially perpendicular with respect to the extension portions 116,118.

The guide member 100 also provides advantages in terms of minimizing the outgassing of debris during separation of the separable contacts 4 (FIG. 1). Referring again to FIGS. 8-10, the barrier portions 124,126 are spaced from each other and located substantially perpendicular to the base 104. Furthermore, the barrier portions 124,126 each extend from the base 104 and the first end portion 108 of the ramp 106. The first end portion 108 of the ramp 106 extends from the first barrier portion 124 to the second barrier portion 126. Referring to FIGS. 1, 4, and 6, the barrier portions 124,126 of the guide member 100 are substantially located between the separable contacts 4 (FIG. 1) and the first printed circuit board 16 (FIG. 6). Thus, it will be appreciated that when the separable contacts 4 open, such as, for example, during a trip condition, debris that would otherwise engage the first printed circuit board 16 (i.e., and cause damage thereto) will engage the barrier portions 124,126. Furthermore, the barrier portions 124,126 also prevent outgassing debris to the accessory pocket areas of the circuit breaker 2. As such, by having the guide members 100,200, outgassing pressure from one compartment to another is minimized and/or prevented.

The guide member 100 is also structured so as to accommodate other components of the circuit breaker 2. Specifically, the circuit breaker 2 further includes a number of light pipes 42,44, a reset button 52 to reset the first printed circuit board 16 in the event of a fault, and a universal serial bus port 54 to allow an operator to connect to the first printed circuit board 16. The light pipes 42,44 each transmit light from the first printed circuit board 16 to an exterior of the circuit breaker 2. For example and without limitation, the first printed circuit board 16 includes a number of light emitting diodes corresponding to different statuses of the circuit breaker (e.g., without limitation, circuit status). As shown in FIG. 1, the light pipes 42,44 each extend at least partially through the secondary covers 12,14 in order to transmit light from the light emitting diodes of the first printed circuit board 16 to an exterior the circuit breaker 2. The guide members 100,200 accommodate these light pipes 42,44.

Figure 11:
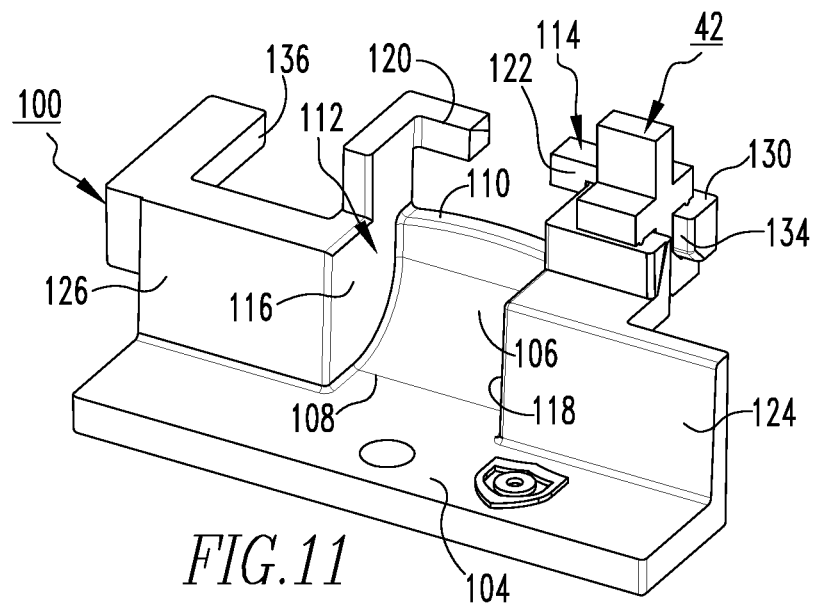
FIG. 11 is a front isometric view of the guide member of FIGS. 8, 9, and 10, shown with a light pipe.
Figure 12:
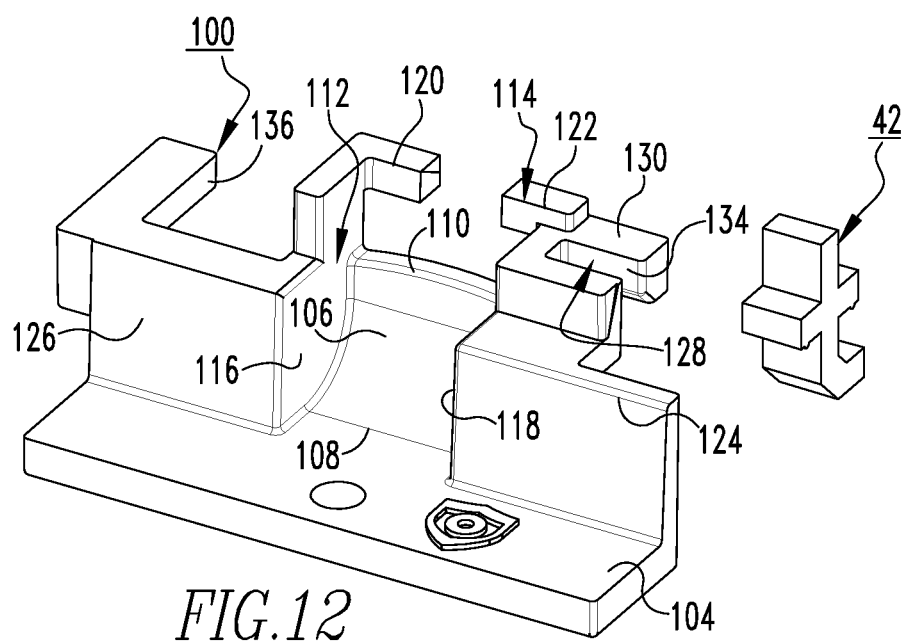
FIG. 12 is an exploded front isometric view of the guide member and light pipe of FIG. 11.

Specifically, referring again to FIGS. 8-10, the receiving portion 128 extends from the first barrier portion 124 and has a top surface 130, a bottom surface 132 located opposite and substantially parallel to the top surface 130, and a middle surface 134 extending between and being located substantially perpendicular with respect to the top and bottom surfaces 130,132. When the secondary cover 12 is in the closed position, the top surface 130 faces the secondary cover 12 and the bottom surface 132 faces away from the secondary cover 12. Referring to FIGS. 11 and 12, the light pipe 42 is preferably coupled to the receiving portion 128 by a press-fit mechanism. As such, the light pipe 42 engages each of the top, bottom, and middle surfaces 130,132,134 in order to be reliably maintained thereon. However, it will be appreciated that other suitable coupling mechanisms are contemplated herein (e.g., without limitation, being coupled via an adhesive).

As mentioned above, the guide members 100,200 are structured so as to accommodate the reset button 52 and the universal serial bus port 54, which are each electrically connected with the first printed circuit board 16. Specifically, the receiving portion 136, as shown in FIG. 8, extends from the second barrier portion 126. It will be appreciated that when the guide members 100,200 are assembled in the circuit breaker 2, the reset button 52 and the universal serial bus port 54 are each located in a corresponding one of the receiving portions 136 (i.e., and the receiving portion of the guide member 200, shown but not indicated).

Accordingly, it will be appreciated that the disclosed concept provides for an improved (e.g., without limitation, better protected against undesirable twisting and folding of cable members 32,34, longer lasting) electrical switching apparatus 2 and guide member 100,200 therefor.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A guide member for an electrical switching apparatus, said electrical switching apparatus comprising a primary cover, a secondary cover structured to move between a closed position and an open position, a first printed circuit board coupled to said primary cover, a second printed circuit board coupled to said secondary cover and being spaced from said first printed circuit board, and a cable member electrically connecting said first printed circuit board to said second printed circuit board, said guide member comprising:
   a body comprising:
      a base structured to be coupled to said primary cover,
      a ramp structured to engage said cable member when said secondary cover is in the closed position, said ramp having a first end portion and a second end portion disposed opposite and distal the first end portion, the first end portion extending from said base, and
      a number of guide portions each extending from said ramp and being structured to engage said cable member when said secondary cover moves between the closed position and the open position in order to minimize twisting and folding of said cable member.

2. The guide member of claim 1 wherein each of said number of guide portions comprises an extension portion and a directing portion extending from the extension portion; wherein the extension portion extends from said ramp; and wherein the directing portion is disposed proximate the second end portion of said ramp.

3. The guide member of claim 2 wherein said number of guide portions comprises a first guide portion and a second guide portion; and wherein the extension portion of said first guide portion is spaced from and disposed substantially parallel to the extension portion of said second guide portion.

4. The guide member of claim 3 wherein the directing portion of the first guide portion is disposed substantially perpendicular to the extension portion of the first guide portion; wherein the directing portion of the first guide portion extends from the extension portion of the first directing portion toward the directing portion of the second guide portion; wherein the directing portion of the second guide portion is disposed substantially perpendicular to the extension portion of the second guide portion; and wherein the directing portion of the second guide portion extends from the extension portion of the second guide portion toward the directing portion of the first guide portion.

5. The guide member of claim 1 wherein said body further comprises a number of barrier portions each extending from said base and the first end portion of said ramp.

6. The guide member of claim 5 wherein said number of barrier portions comprises a first barrier portion and a second barrier portion spaced from said first barrier portion; and wherein the first end portion of said ramp extends from said first barrier portion to said second barrier portion.

7. The guide member of claim 6 wherein each of said first barrier portion and said second barrier portion is disposed substantially perpendicular to said base.

8. The guide member of claim 1 wherein said body is a unitary component made from a single piece of material.

9. An electrical switching apparatus comprising:
a primary cover;
at least one secondary cover structured to move between a closed position and an open position;
a first printed circuit board coupled to said primary cover;
a number of other printed circuit boards each coupled to a corresponding one of said at least one secondary cover and being spaced from said first printed circuit board;
at least one cable member electrically connecting said first printed circuit board to a corresponding one of said number of other printed circuit boards; and
at least one guide member comprising:
a body comprising:
a base coupled to said primary cover,
a ramp engaging said at least one cable member when said at least one secondary cover is in the closed position, said ramp having a first end portion and a second end portion disposed opposite and distal the first end portion, the first end portion extending from said base, and
a number of guide portions each extending from said ramp and engaging said at least one cable member when said at least one secondary cover moves between the closed position and the open position in order to minimize twisting and folding of said at least one cable member.

10. The electrical switching apparatus of claim 9 wherein each of said number of guide portions comprises an extension portion and a directing portion extending from the extension portion; wherein the extension portion extends from said ramp; and wherein the directing portion is disposed proximate the second end portion of said ramp.

11. The electrical switching apparatus of claim 10 wherein said number of guide portions comprises a first guide portion and a second guide portion; and wherein the extension portion of said first guide portion is spaced from and disposed substantially parallel to the extension portion of said second guide portion.

12. The electrical switching apparatus of claim 11 wherein, when said at least one secondary cover is in the closed position, said at least one cable member is disposed between the extension portion of said first guide portion and the extension portion of said second guide portion.

13. The electrical switching apparatus of claim 11 wherein, when said at least one secondary cover is in the closed position, said at least one cable member is disposed substantially perpendicular to the extension portion of said first guide portion and the extension portion of said second guide portion.

14. The electrical switching apparatus of claim 9 wherein said ramp is concave facing away from said first printed circuit board.

15. The electrical switching apparatus of claim 9 wherein said body further comprises a number of barrier portions each extending from said base and the first end portion of said ramp.

16. The electrical switching apparatus of claim 15 wherein said number of barrier portions comprises a first barrier portion and a second barrier portion spaced from said first barrier portion; wherein said body further comprises a receiving portion extending from said first barrier portion; wherein said electrical switching apparatus further comprises a light pipe coupled to said receiving portion by a press-fit mechanism; and wherein said light pipe is structured to transmit light from said first printed circuit board to an exterior of said electrical switching apparatus.

17. The electrical switching apparatus of claim 16 wherein said receiving portion has a top surface, a bottom surface disposed opposite the top surface, and a middle surface extending between the top surface to the bottom surface; wherein, when said at least one secondary cover is in the closed position, the top surface faces said at least one secondary cover and the bottom surface faces away from said at least one secondary cover; and wherein said light pipe engages each of the top surface, the middle surface, and the bottom surface.

18. The electrical switching apparatus of claim 17 wherein said light pipe extends at least partially through said at least one secondary cover.

19. The electrical switching apparatus of claim 15 wherein said number of barrier portions comprises a first barrier portion and a second barrier portion spaced from said first barrier portion; wherein said body further comprises a receiving portion extending from said second barrier portion; wherein said electrical switching apparatus further comprises a component selected from the group consisting of a universal serial bus port electrically connected with said first printed circuit board and a reset button electrically connected with said first printed circuit board; and wherein said component is disposed in the receiving portion.

20. The electrical switching apparatus of claim 19 wherein said at least one secondary cover comprises a first secondary cover and a second secondary cover; wherein said number of other printed circuit boards comprises a second printed circuit board and a third printed circuit board each coupled a corresponding one of said first secondary cover and said second secondary cover; wherein said at least one cable member comprises a first cable member and a second cable member each electrically connecting said first printed circuit board to a corresponding one of said second printed circuit board and said third printed circuit board; wherein said at least one guide member comprises a first guide member and a second guide member; wherein said component is a universal serial bus port electrically connected with said first printed circuit board; wherein said electrical switching apparatus further comprises a reset button electrically connected with said first printed circuit board; wherein said universal serial bus port is disposed in the receiving portion of said first guide member; and wherein said reset button is disposed in the receiving portion of said second guide member.

* * * * *